United States Patent [19]

Henley

[11] Patent Number: 5,570,011

[45] Date of Patent: *Oct. 29, 1996

[54] METHOD FOR TESTING AN ELECTRONIC DEVICE USING VOLTAGE IMAGING

[75] Inventor: Francois J. Henley, Los Gatos, Calif.

[73] Assignee: Photon Dynamics, Inc., Milpitas, Calif.

[ * ] Notice: The term of this patent shall not extend beyond the expiration date of Pat. No. 5,391,985.

[21] Appl. No.: 321,948

[22] Filed: Oct. 12, 1994

Related U.S. Application Data

[63] Continuation of Ser. No. 847,556, Mar. 6, 1992, Pat. No. 5,391,985.

[51] Int. Cl.$^6$ .................................................. G01R 31/28
[52] U.S. Cl. ..................................... 324/158.1; 324/73.1
[58] Field of Search .......................... 324/158.1, 73.1, 324/96, 117 R, 760, 765, 770, 71.3; 356/364, 367, 368; 348/126; 250/310, 311; 364/550

[56] References Cited

U.S. PATENT DOCUMENTS

| | | | |
|---|---|---|---|
| 4,203,132 | 5/1980 | Schmitt et al. | 358/101 |
| 4,654,583 | 3/1987 | Ninomiya et al. | 324/73 PC |
| 4,870,357 | 9/1989 | Young et al. | 324/158 R |
| 4,983,911 | 1/1991 | Henley | 324/158 R |
| 5,034,683 | 7/1991 | Takahashi et al. | 324/158 R |
| 5,097,201 | 3/1992 | Henley | 324/96 |
| 5,124,635 | 6/1992 | Henley | 324/96 |
| 5,157,327 | 10/1992 | Henley | 324/158 R |
| 5,170,127 | 12/1992 | Henley | 324/658 |
| 5,204,617 | 4/1993 | Kumagai | 324/158 R |
| 5,270,655 | 12/1993 | Tomita | 324/158 R |
| 5,391,985 | 2/1995 | Henley | 324/158.1 |

*Primary Examiner*—Vinh P. Nguyen
*Attorney, Agent, or Firm*—Townsend and Townsend and Crew LLP

[57] ABSTRACT

An array of circuit elements which when excited produces voltages is analyzed by examining successive voltage images produced by the circuit elements. Specifically, the array of circuit elements is repeatedly excited at high speed while the voltage image produced by the array is electro-optically sampled at a succession of clock times using a relatively slow-speed electro-optic image sampling technique using a burst clock, thereby to capture a succession of voltage images. The successive voltage images can be viewed on a display device directly individually, or they can be processed by an image processor which compares the successive voltage images with stored representations of voltage images to yield information regarding the condition of the array. Maximum permissible device operating speed can also be determined without examination of individual cells.

10 Claims, 5 Drawing Sheets

METHOD FOR TESTING AN ELECTRONIC DEVICE USING VOLTAGE IMAGING

CROSS REFERENCE TO RELATED APPLICATIONS

This is a Rule 60 Continuation of U.S. Ser. No. 07/847,556, filed Mar. 6, 1992, now U.S. Pat. No. 5,391,985.

BACKGROUND OF THE INVENTION

This invention relates to testing of integrated circuit boards, panels of integrated circuit devices, liquid crystal display (LCD) panels and particularly active matrix LCD panels.

One of the challenges in testing panels such as liquid crystal display panels is to be able to handle compact arrays of very large numbers of pixels. Active matrix LCD panels are now being manufactured in volume with integrated drivers on the panel in connection with polysilicon TFT structures. In normal application the integrated drivers are clocked at the relatively high speed of several Megahertz in order to address all of the lines of a relatively high density display within the time set aside for a single frame.

The demand is growing to test large high-speed arrays in circuit panels. Specifically, there is a need to be able to examine many thousands of different individual voltage points in an array at high speeds and to be able to determine the relative logic states of the voltages so captured. One application is in circuit board subsystem testing or multichip module testing.

A technology is now available for examining large numbers of individual voltage points simultaneously. However, this technology, which employs voltage imaging using polymer dispersed liquid crystals (PDLC), is relatively slow in that signal changes of less than one or two milliseconds in switching time cannot be sensed in real time. What is needed is a technique for overcoming the relatively slow behavior of polymer dispersed liquid crystals in order to take advantage of the high density of the technology to analyze large arrays of high speed switched circuits.

SUMMARY OF THE INVENTION

According to the invention, an array of circuit elements which when excited produces voltages is analyzed by examining successive voltage images produced by the circuit elements. Specifically, the array of circuit elements is repeatedly excited at high speed while the voltage image produced by the array is electro-optically sampled at a succession of clock times using a relatively slow-speed electro-optic image sampling technique using a burst clock, thereby to capture a succession of voltage images. The successive voltage images can be viewed on a display device directly individually, or they can be processed by an image processor which compares the successive voltage images with stored representations of voltage images to yield information regarding the condition of the array.

The invention will be better understood by reference to the following detail description in connection with the accompanying drawings.

DESCRIPTION OF SPECIFIC EMBODIMENTS

Figure 1:
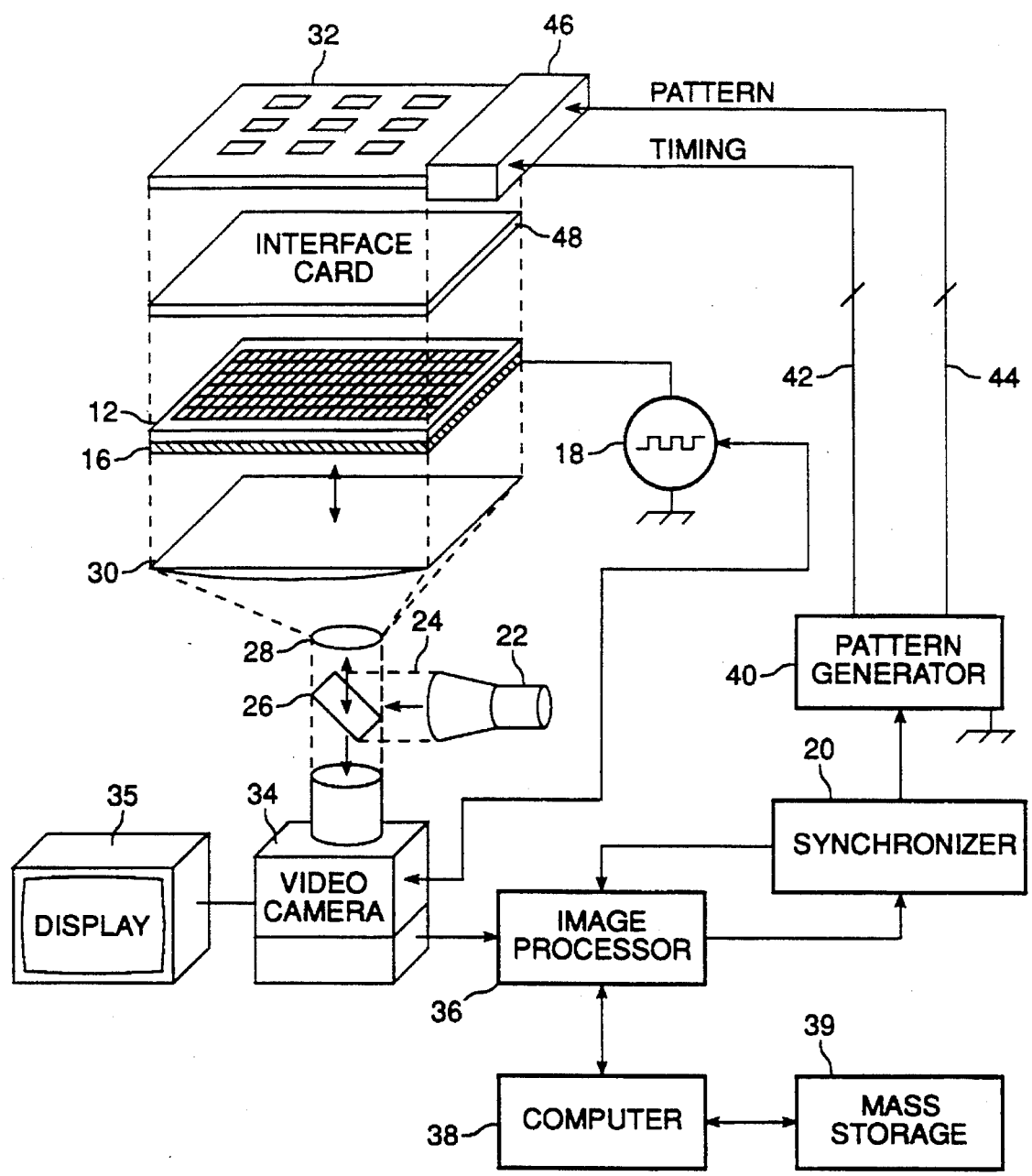
FIG. 1 is a block diagram of a voltage image array system in accordance with the invention.

FIG. 1 illustrates an embodiment of a testing apparatus 10 according to the invention showing elements of the apparatus. For clarity, the view is exploded, and related mechanical support structures are not shown. The testing apparatus 10 according to the invention includes a voltage imaging modulator unit 12 as hereinafter explained and related electronic driving means, illuminating means, sensing means and display or processing means.

The voltage imaging modulator unit 12 comprises a two-dimensional detector surface 14 and related structure as explained below overlying a microscopically-thin electric field-sensitive optically-transparent electrode layer 16 to which a two-dimensional distribution of electric field distribution is transferred through the detector surface 14. The electrode layer 16 is coupled to a bias generator 18 which operates under the control of a synchronizer 20.

The modulator unit 12 is illuminated from a light source 22, which projects an optical beam 24 from the side of the modulator unit 12 opposite the device under test (DUT) 32 on a reflected path through a beam splitter 26 and optionally through a spreading and collimating lens system 28, 30. The modulator unit 12 is disposed between the electrode panel 16 and the device under test (DUT) 32. There is an optional interface element 48 between the DUT 32 and the modulator unit 12 which serves to planarize and translate voltage between the two-dimensional surface the DUT 32 presented to the detector surface 14. The separation between the DUT 32 or its planarized voltage distribution of the interface card 48 and the modulator unit 12 is preferably on the order of a few micrometers to a few millimeters, or the modulator unit 12 may be in direct contact with the DUT 32, depending upon the type of modulator unit 12 as explained hereinafter.

Light patterns are produced in the modulator unit 12 according to the electro-optic interaction of the voltages at positions on the DUT 32 (or projected positions on the interface card 48) with the modulator unit 12. The light patterns over the two-dimensional surface of the modulator unit 12 are captured through a video camera 34 or other light-sensitive imaging device or array on the direct path through the beam splitter 26. Each of the images captured by the video camera 34 is output from the video camera 34 to an optional display unit 35 (a cathode ray tube or CRT display for example) and/or captured and processed by an image processor 36 under control of computer 38. The results produced from the image processor image may be recorded for subsequent analysis. Selected results may be communicated to a synchronizer 20 which in turn controls a test pattern generator 40.

The computer 38 may store in an appropriate image mass storage device 39, such as a hard disk drive, representations of voltage images of known good devices at selected (e.g., successive) states. The image processor 36 may digitally or optically compare the measured successive voltage images of the DUT 32 with the stored representations. The pattern generator 40 provides timing control 42 and pattern control 44 to the device under test 32 through an electronic interface adaptor 46.

The DUT is for example a multi-chip module or circuit card. On one side, circuit elements 33 are mounted. On the opposing or undersurface side 35, circuit traces (not shown) are disposed close to or on the undersurface 35. Optionally, the DUT 32 is mounted on or connected to interface card 48. The purpose of the interface card 48 is to planarize the test field. The interface card may be a bed-of-nails array or a so-called Z-conducting elastomer plate, wherein electric signals are conducted or projected along the Z-axis of the plate corresponding to the desired test points into proximity with the detector surface 14 of the modulator unit 12. Optionally, the interface card 48 may be a capacitance coupling structure (such as an air gap or other dielectric) of the type employed for non-contact voltage imaging testing developed by Photon Dynamics, Inc., of Milpitas, Calif. and described in U.S. patent application Ser. No. 07/658,132 filed Feb. 19, 1991 (now U.S. Pat. No. 5,170,127). Conventional test systems however would typically employ contact-type structures.

Figure 2:
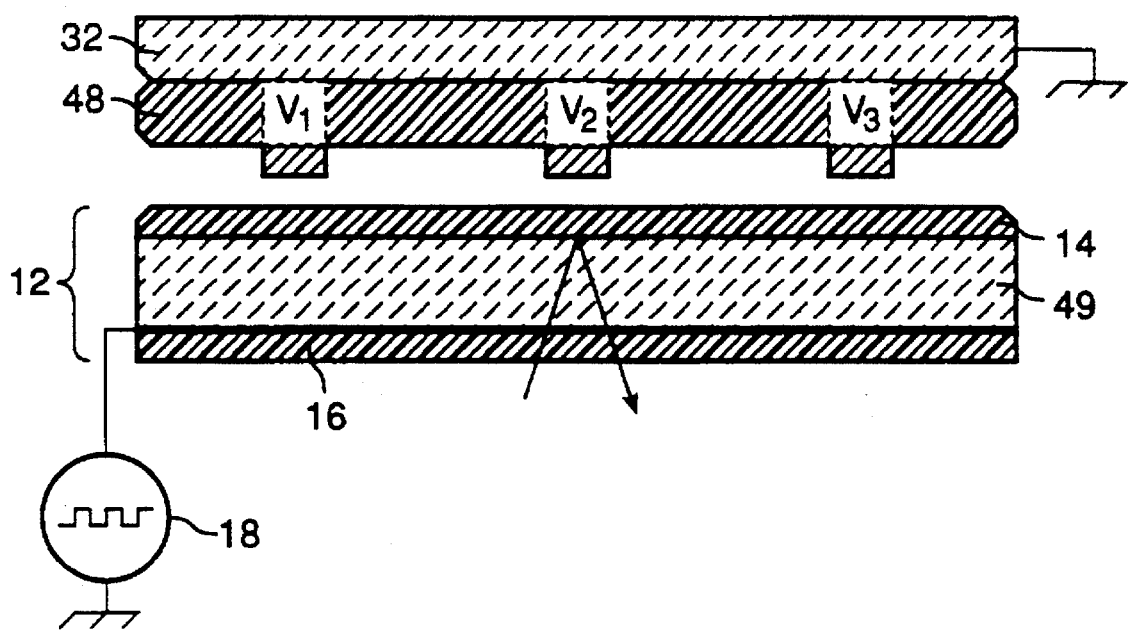
FIG. 2 is a block diagram of a first array modulator in accordance with the invention.

Referring to FIG. 2, there is shown one of two optional structures for a modulator unit 12. Herein the modulator unit 12 employs non-contact capacitive coupling to the DUT 32. The modulator unit 12 comprises a detector surface 14 which is a dielectric mirror film of approximately 1–10 micrometers thickness on a sheet of modulator material 49, which is preferably PDLC or NCAP. On the opposing side of the modulator material 49 is the electrode layer 16, which is preferably a sheet of transparent conductive material, such as an indium tin oxide (ITO) coating on a polymer film, such as Mylar-type film. The mirror film 14 is reflective of light passing through the electrode layer 16. Scattering of the light is changed locally in the modulator material 49 by the local electric fields of voltages produced adjacent the surface of the interface card 48. The field is developed between the electrode layer 16 and the voltage sources (referenced to ground) at the positions on the interface card 48, as indicated by the gap $V_1$ to $V_2$. There is preferably no contact between the interface card 48 and the mirror film 14. The mirror film 14 must be an insulator so that the electric fields can penetrate. (Conductive metal is permitted if it is limited to the exact pattern of conductive elements to be tested, as explained hereinafter.) This structure, a capacitance-coupled test probe, is suited to a.c. signal testing as well as to chopped d.c. signal testing, where there is a brief storage of a detectable charge at the positions to be tested within the DUT 32.

Figure 3:
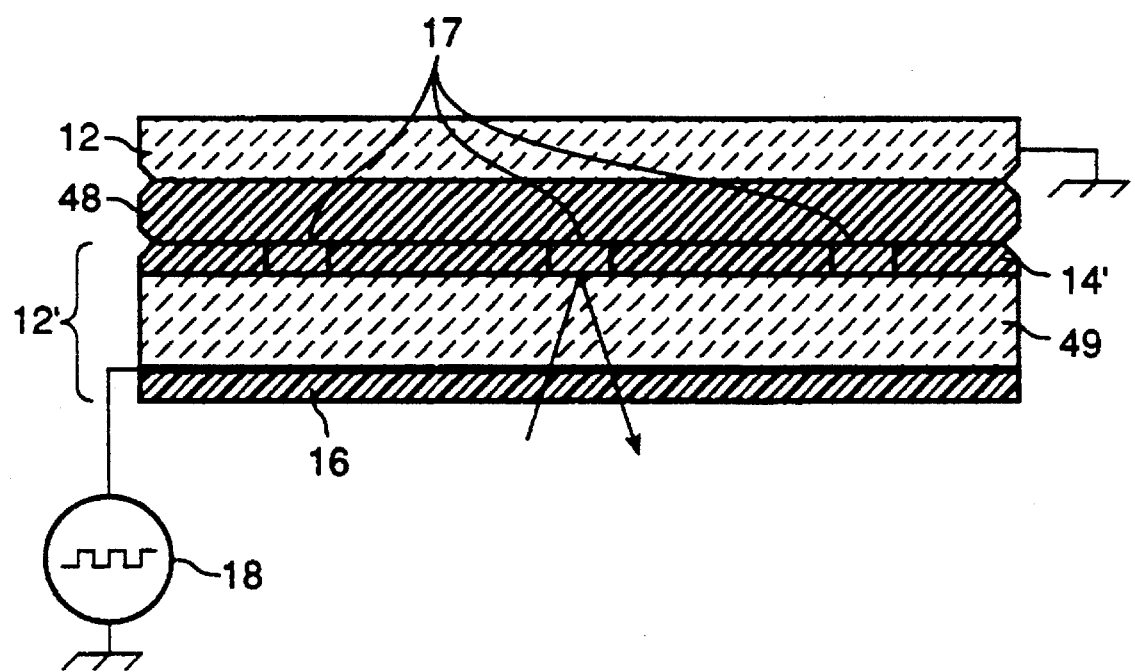
FIG. 3 is a block diagram of a second array modulator in accordance with the invention.

A second type of modulator unit 12' is illustrated in FIG. 3. Herein the modulator unit 12' comprises a detector surface 14' which is a sheet of insulative material wherein specific positions or spots 17 are electrically-conductive. The sheet 14' is disposed on a sheet of modulator material 49, as before. On the opposing side of the modulator material 49 is the electrode layer 16, which is preferably a sheet of transparent conductive material, such as an indium tin oxide (ITO) coating on a polymer film, as before. The spots 17 are individually reflective of light in a similar manner so that the mirror film 14 of the alternative embodiment is reflective of light passing through the electrode layer 16 but is electrically conductive. Scattering of the light is changed locally in the modulator material 49 by the local electric fields of voltages produced adjacent the surface of the interface card 48. The field is developed between the electrode layer 16 and the voltage sources of the DUT 32. In this case, however, the interface card 48 carrying the DUT 32 is in direct electrical contact with the detector surface 14, Hence, this test configuration can be used for true d.c. signal testing, as well as for a.c. testing where contact between structures is permissible.

According to the invention, imaging is effected through a mechanism of burst clocking. Specifically, in the technique, control of the DUT 32 is clocked for a burst period by or in synchronism with the high-speed pattern generator 40, the pattern generator 40 operating at clock speed within the design parameters of the DUT 32 but at generally a substantially greater speed than that which would permit the capture of successive voltage images of the DUT 32 through the modulator unit 12 (12'). This progressive sampling technique is explained with reference to FIG. 4.

Figure 4:
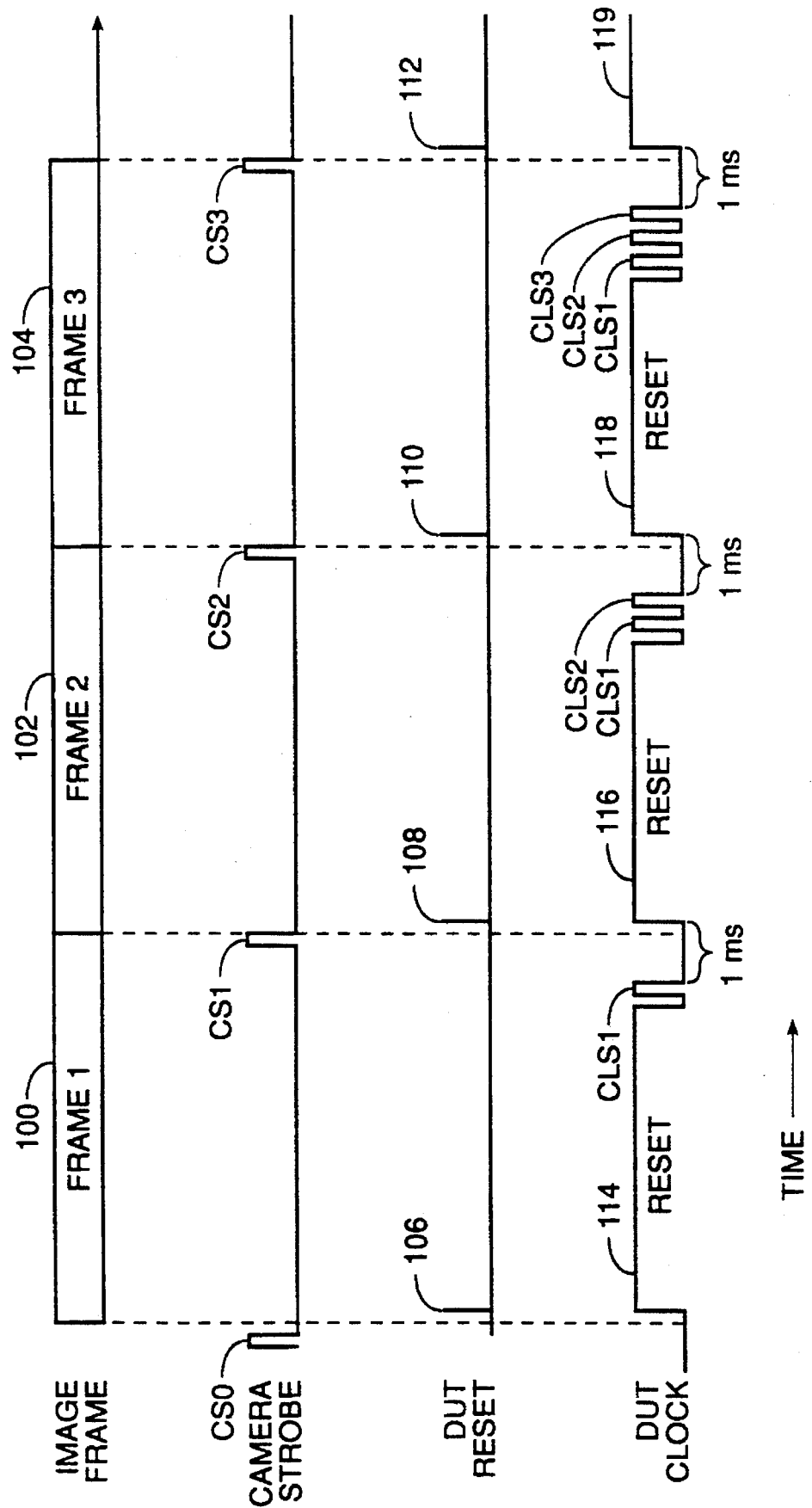
FIG. 4 is a timing diagram illustrating a sampling technique in accordance with the invention.

Referring to FIG. 4, a timing diagram illustrates the image capture technique according to the invention. Images are formed during frame times, as for example frame time 100 for frame 1, frame time 102 for frame 2 and frame time 104 for frame 3, and so forth.

A camera strobe is invoked at the end of each time frame. For example, frame time 0 which precedes frame 1 is captured at the time of camera strobe CS0. Frame 1 is captured at the time of camera strobe CS1 which occurs at the end of frame 1. Frame 2 is captured at the time of camera strobe CS2 at the end of frame 2, and frame 3 is captured at the time of camera strobe CS3 at the end of frame 3. It is important to allow adequate time for the image to settle, and hence, the camera strobes each occur at the end of each frame.

The device under test 32, however, operates under control of a high-speed clock. Each device under test 32 must be initialized or otherwise set to a known state in response to a reset signal or the equivalent, as for example reset strobe signals invoked manually or under automatic control. Reset strobes 106, 108, 110, and 112 each invoke a reset sequence, respectively, reset sequence 114, reset sequence 116, reset sequence 118, and reset sequence 119. According to the invention, the high-speed clock to the device under test 32 is run for a burst period, then terminated (hence it is referred to as a burst clock), so that the clock state of the device under test 32 advances incrementally a selected number of clock states (e.g., for as little as one clock state) from a known reset or initial state for each frame time of the imaging device. Moreover, the last clock state is held (eg. for the relatively long time of approximately 1 ms) prior to the camera strobe signal CS__ to allow the imaging device to settle to a stable state.

For example, following reset period 114, the device under test 32 is advanced from zero to clock state one (CLS1). Following reset period 116 the device under test 32 is advanced from zero again, but through clock state one to clock state two (CLS2). Following the reset period 118, the device under test 32 is advanced from zero through clock state one (CLS1), clock state two (CLS2), to clock state three (CLS3) before the clock is suspended to allow the image of the imaging device to stabilize and be registered. The reset periods 114, 116 and 118 may be progressively shorter to assure that the settling time for the last-invoked clock state during the respective frame is at least 1 ms in length.

It should be understood that not every state needs to be measured in a sequence. Selected states can be measured at the frame rate of a camera, for example, the frame rate being typically around 1/20th to 1/60th of a second.

Figure 5:
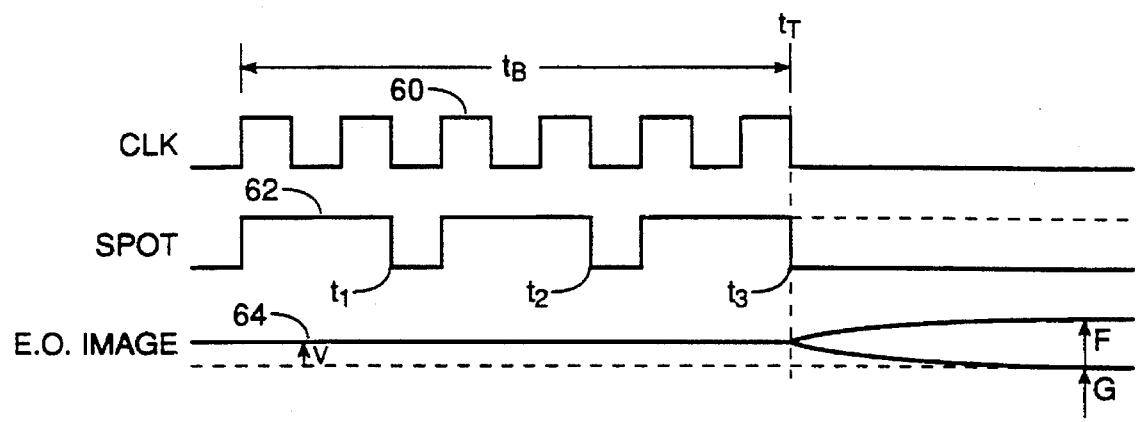
FIG. 5 is a further timing diagram illustrating burst clocking and sampling in accordance with the invention.

The frame information so captured is passed onto the image processor 36 (FIG. 1) for storage and analysis. The detection at each spot is effected as follows: Referring to FIG. 5, a clock signal CLK 60 is applied to the DUT 32 for a burst period $t_B$ until a termination time $t_T$. Voltage response 62 in the DUT 32 is in accordance with circuit operation at selected point of interest $t_1$, $t_2$, $t_3$, where $t_3$ corresponds to $t_T$, the end of the burst clock period. In the modulator material 49, an average Electro-Optic (E-O) response 64 develops to the ongoing clock signal 60. At the end of the burst clock period, the E-O response reacts (in accordance with the time constant of the modulator material 49) by moving higher or lower to the retained voltage state of the spot voltage response signal 62, as established at the end of the burst clock period. If the voltage response signal 62 is expected to be low, then the sensing of an E-O effect indicative of a low signal at that spot is recognized as a proper or "good" response G. If the voltage response signal 62 is expected to be low, then the sensing of an E-O effect indicative of a high signal at that spot is recognized as an improper or "fault" response F. This process occurs for each spot at for example approximately 10,000 different locations for each burst clock period.

The frame image information is for example compared with the voltage response image or signature of a known good device corresponding to the device under test to determine if there are any differences in resultant images. By correlation between the corresponding frames, errors and faults can be readily identified.

One of the features of the invention is the ability to do a binary search to find out which of the DUT states produces bad results. For example, an image produced at the end of the first burst clock period or clock state one may well be perfect. An image produced at 500th clock state may reveal bad states when compared with the image of a known good device, and this will be the first indication that a fault exists. A binary search can then be made by repeating this test following the next reset of the clock by sampling the voltage response image (e.g., by strobing the camera) after terminating the burst clock at for example clock state 250, the half-time of the previous test. If errors are still present, the camera strobe can be invoked after clock state 125. At for example clock state 125 no faults will be evident. The binary search is then advanced by strobing the camera after clock state 188, one-half of the time between clock state 125 and clock state 250. At that point a fault might be evident. The clock strobe might then be invoked to run clock state 155 to more narrowly bracket the clock state in which the fault is evident, each time halving the time difference between the current burst clock period and the previous burst clock period, i.e., before and after the indicated fault. This bracketing process continues until the exact clock state in which a particular fault is first evident has been identified.

The sensing device need not be a video camera. In an alternative embodiment, and referring to FIG. 1, the video camera 34 can readily be replaced directly by a CCD array. A 100 by 100 element array (having therefor 10,000 potential test points) may be used to identify individual points on a device under test 32. As compared with the structure of a more conventional bed-of-nails probe panel, a CCD array is an extremely inexpensive and easily realized structure for high density testing of structures.

Figure 6:
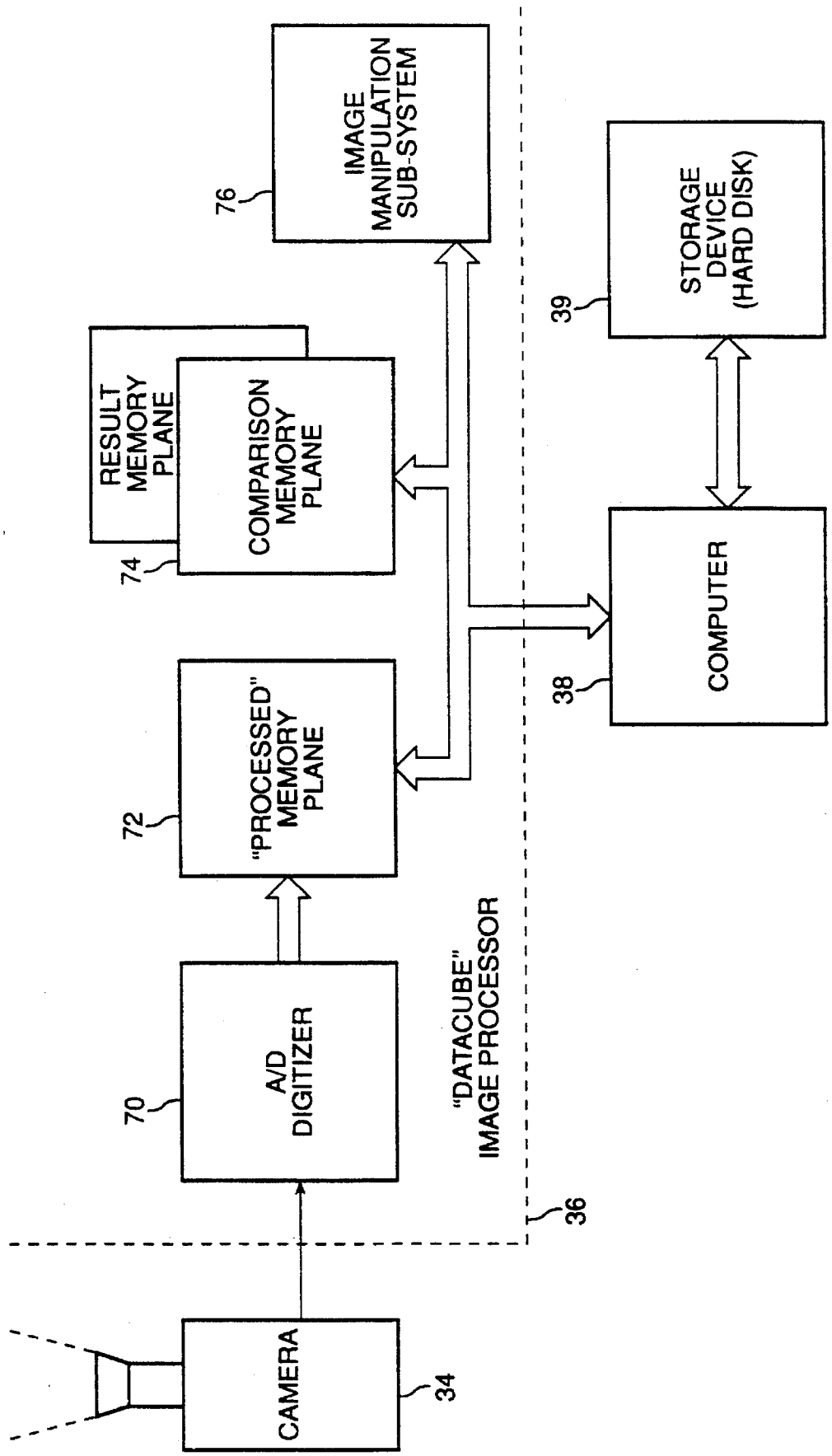
FIG. 6 is a block diagram illustrating an image processor in accordance with the invention.

Referring to FIG. 6, there is shown one configuration of the image processor 36 and related computer system 38, 39. The camera 34 or equivalent feeds a captured image frame to an analog to digital digitizer 70 at the input of the image processor 36. The captured image from the camera is thereafter transferred to a memory "plane" 72, preferably after calibration, normalization, correction for gain variations. The computer 38, in response to commands from the image processor 38, retrieves from the mass storage device 39 a representation of a stored image corresponding to the clock state of the captured image in memory plane 72. The stored image representation is then transferred to a comparison memory "plane" 74. An image manipulation subsystem 76 undertakes an image-plane-to-image-plane comparison, such as by a logical intersection operation, which yields a "result." The "result" may be another image stored in one of the "planes" of the image processor 36, which is readily examined by conventional processing techniques. A simple go/no-go decision may be based on the result.

The image processor 36 and related computer system 38, 39 are commercially-available components. The image processor is for example of the Digimax series of DataCube, an image processor capable of performing image comparison at a rate of 10 million pixels per second, and thus able to perform an image comparison on a typical frame in about 30 ms. The Digimax series is constructed around an industry-standard computer bus, namely, the VME bus. The control computer 38 and related peripherals may be any VME-bus based computer.

Figure 7:
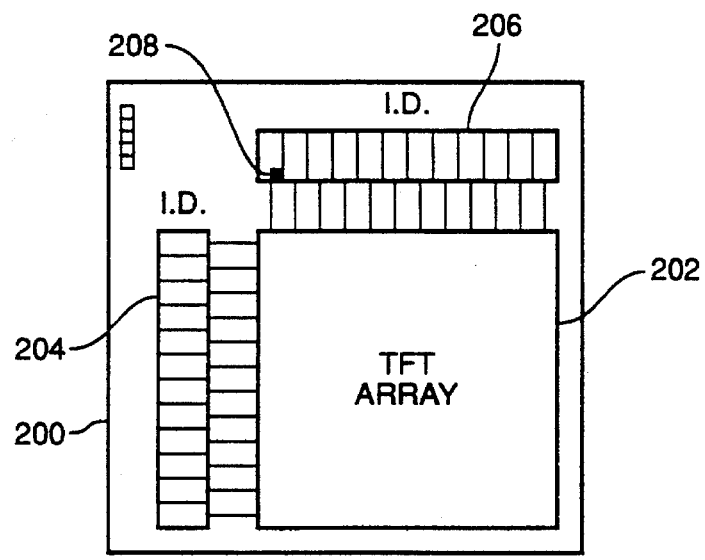
FIG. 7 is a block diagram of an array with integrated drivers as may be tested in accordance with the invention.

FIG. 7 is a schematic diagram of another type of device adapted to be tested in accordance with the invention, and specifically a flat panel LCD device. In this case, an interface card 48 is not needed. A liquid crystal display panel 200 comprises an array 202 of cells in a two-dimensional matrix with an integrated driver set 204 for the rows and an integrated driver set 206 for the columns. The integrated driver sets 204 and 206 comprise a series of registers used to hold information for driving each row and each column through simple line drivers. In order to test such a structure with the integrated driver set, a metal pad 208 is provided at the time of manufacture at the edge of each integrated driver which is electrically coupled to the potential produced at the output of the integrated driver. The voltage produced on the integrated driver can be used according to the invention to produce a voltage image. The voltage image can be analyzed in the same way as any other device under test, including in response to the signals of a pattern generator 40 driving the LCD panel as a device under test. Thus, drivers can be tested at very high speed by non contact voltage or capacitance imaging techniques.

The method of the invention may be adapted to test a DUT without examination of each individual state. For example, the long time constant of the modulating material 49 can be employed to measure the RMS voltage of a row. Because of speed mismatch between the pulses used to excite the devices and the modulator material 49, the modulator material is inherently an integrator. By running the test repetitively for a full frame duration (i.e., minimal delay between the end of the test run and the beginning of the next test run and little or no reset period, so that the loop period is less than the decay time of the modulator material 49), the voltage output of the measuring element observing the modulator material 49 is the RMS voltage of the test sequence. This test is particularly useful for identifying stages which are not work, as the RMS voltage of the test sequence will be zero of maximum, and not some intermediate RMS voltage. Moreover, the RMS test regimen is very useful for testing for maximum allowable operating frequency. The excitation rate of the pulses from the pattern generator may be increased until a clock rate is attained at which stages of the DUT 32 cease to respond normally. The output of the sensor will depart, generally abruptly, from an RMS value. Hence, the maximum operating speed for that stage can be identified.

The method of the invention may test for a maximum permissible device operating speed by comparing RMS voltage readings. The method includes storing a first RMS voltage reading which will be compared to a second RMS voltage reading, and setting the device to a first known state. The device is then operated at a second clock speed which is higher than the first clock speed for a plurality of clock cycles. Thereafter within a period of time less than the inherent decay of the voltage image modulator material, the device is repetitively reset to the first known state and operated for at least the plurality of clock cycles. A voltage image is captured for the cycles representing the second clock speed to obtain a second RMS voltage reading. The maximum permissible operating speed is indicated by the difference between the first RMS voltage reading and second RMS voltage reading. Such difference is sensed by comparing the first and second RMS voltage reading for a difference.

The invention has advantages in use with LCD devices, since it is capable of carrying out tests at any speed, and it allows accurate visualization of states of the device under test. When used with multi-chip modules, the invention is a potentially very low cost alternative to convention point contact testers. It is also contemplated that this invention will be useful for examining and testing the operation of integrated circuits, particularly because the invention allows the visualization of voltage states in two dimensions.

The invention has been explained with reference to specific embodiments. Other embodiments will be apparent to those ordinary skill in the art. It is therefore not intended that this invention be limited except as indicated by the appended claims.

What is claimed is:

1. A method for testing an electronic device which operates at a normal clock rate and which produces a two-dimensional voltage image, said testing method using a voltage image sensing means and means for exercising the electronic device, said voltage image sensing means not being capable of responding at the normal clock rate of the electronic device, said method comprising the steps of:

setting, by means of said exercising means, the electronic device to a first known state, said exercising means comprising a pattern generator;

operating, by means of said exercising means, the electronic device at its normal clock rate for a first preselected count of clock cycles;

suspending operation of the electronic device, by means of said exercising means, at said first preselected clock cycle count;

after a preselected interval, capturing, by means of said voltage imaging means, a first voltage image at said first preselected clock cycle count; and comparing said first voltage image with a first known good image at said first preselected clock cycle count to determine if the first voltage image differs from the first known good image indicative that faults are present in the electronic device.

2. The method of claim 1 wherein said exercising means further comprises a synchronizer, said synchronizer coupled to said pattern generator.

3. The method of claim 1 wherein said voltage imaging means comprises a voltage image modulator unit.

4. The method of claim 1 wherein said voltage imaging means comprises a camera.

5. The method of claim 1 wherein said comparing step is a digital comparing technique.

6. The method of claim 1 wherein said comparing step is an optical comparing technique.

7. The method of claim 1 wherein said electronic device is a multi-chip module.

8. The method of claim 1 wherein said electronic device is a circuit card.

9. The method of claim 1 wherein said exercising means operates under a high speed clock.

10. An apparatus for testing an electronic device which operates at a normal clock rate and which produces a two-dimensional voltage image, said apparatus comprising:

a voltage image sensing modulator unit adapted to capture said voltage image of the device by an electro-optic interaction, said voltage image sensing modulator unit not being capable of responding at the normal clock rate of the device;

a pattern generator coupled to a synchronizer adapted to set the device to a first known state and to operate the device at said normal clock rate for preselected counts of clock cycles and to suspend operation of the device at a first preselected clock cycle count; and a camera unit coupled to an image processor adapted to capture a first voltage image from said voltage image sensing modulator unit at said first preselected clock cycle count at a preselected interval after suspending operation of said device.

* * * * *